United States Patent
Zabroda (10) Patent No.: US 6,229,396 B1
(45) Date of Patent: May 8, 2001

(54) CONTROLLED IMPEDANCE TRANSFORMER LINE DRIVER

(75) Inventor: Oleksiy Zabroda, Kanata (CA)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/498,038

(22) Filed: Feb. 4, 2000

(51) Int. Cl.[7] .......................................... H03F 3/26
(52) U.S. Cl. ................................. 330/276; 330/195
(58) Field of Search ................................ 330/165, 195, 330/255, 276

(56) References Cited

U.S. PATENT DOCUMENTS

| | | | |
|---|---|---|---|
| 4,798,982 | 1/1989 | Voorman | 307/490 |
| 4,992,751 * | 2/1991 | Attwood et al. | 330/10 |
| 5,121,080 | 6/1992 | Scott, III et al. | 330/260 |
| 5,249,225 | 9/1993 | Williams | 379/404 |
| 5,459,440 | 10/1995 | Claridge et al. | 333/17.3 |
| 5,510,751 | 4/1996 | Nauta | 330/84 |
| 5,585,763 | 12/1996 | Navabi et al. | 330/255 |
| 5,625,320 * | 4/1997 | Hagerty | 330/260 |
| 5,838,722 * | 11/1998 | Consi | 330/291 |
| 5,936,393 | 8/1999 | Nauta | 323/316 |
| 5,973,490 | 10/1999 | Nauta | 323/316 |
| 6,055,418 * | 4/2000 | Harris et al. | 330/295 |

OTHER PUBLICATIONS

B. Nauta, et al., "Analog Video Line Driver with Adaptive Impedance Matching", ISSCC98, Session 20, SA 20.1, Feb. 7, 1998.

R. Mahadevan, et al., "A Differential 160MHz Self-Terminating Adaptive CMOS Line Driver", ISSCC2000, Session 26, WP 26.6, Feb. 9, 2000.

D. Johns, et al., "Integrated Circuits for Data Transmission Over Twisted Pair Channels", 1997 IEEE Journal of Solid-State Circuits, vol. 32, No. 3, Mar. 1997, pp.398–406.

* cited by examiner

Primary Examiner—Robert Pascal
Assistant Examiner—Khanh Van Nguyen
(74) Attorney, Agent, or Firm—Theodore E. Galanthay; Lisa K. Jorgenson; Andre Szuwalski (57) ABSTRACT

A pair of equivalent controlled impedance buffers are connected in a push-pull configuration to the primary coil of a transformer. A pair of equivalent pre-drivers are connected to the pair of buffers. Each pre-driver receives a driver input signal and outputs a buffer input signal and a flyback compensation signal proportional thereto. Each buffer receives the buffer input signal generated from one of the pre-drivers for buffered output as a line driver signal to the primary coil. A flyback voltage effect is induced in each buffer due to the line driver signal applied to the primary coil by the other buffer. Each buffer further receives the flyback compensation signal generated from the other one of the pre-drivers, with the buffer operating to cancel the flyback voltage effect induced in that buffer by the line driver signal applied to the primary coil by the other buffer using the flyback compensation signal received from the other one of the pre-drivers.

11 Claims, 12 Drawing Sheets

CONTROLLED IMPEDANCE TRANSFORMER LINE DRIVER

BACKGROUND OF THE INVENTION

1. Technical Field of the Invention

The present invention relates to a line driver having a controlled output impedance and, in particular, to a transformer line driver.

2. Description of Related Art

Figure 1:
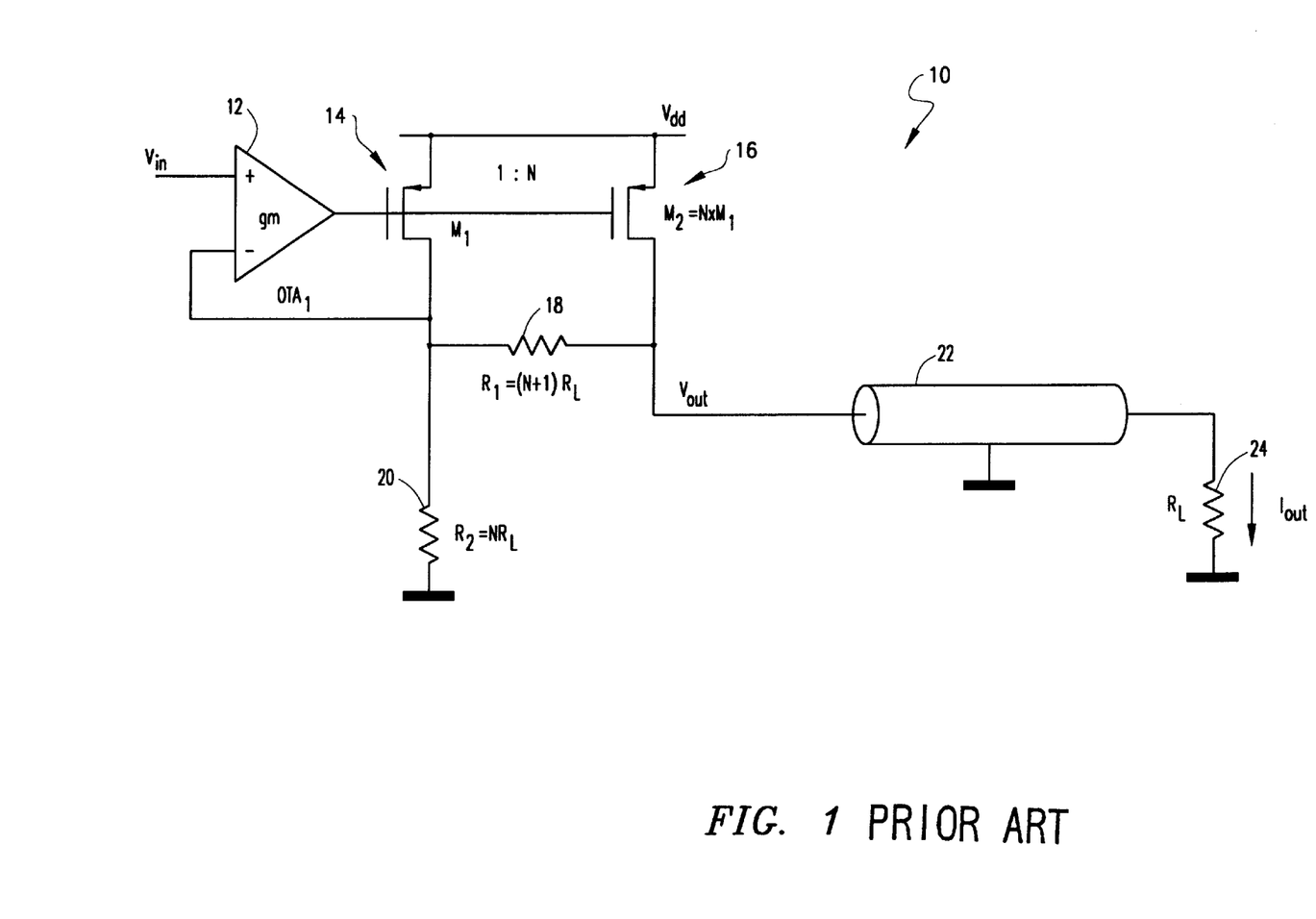
FIG. 1, previously described, is a schematic diagram of a prior art line driver having a controlled output impedance.

Line drivers having a controlled output impedance are well known in the art. See, B. Nauta, et al., "Analog Video Line Driver with Adaptive Impedance Matching", ISSCC98, pp. 318–19, 1998. A simplified schematic of one such driver 10 is illustrated in FIG. 1. The driver 10 (also referred to as a "buffer") comprises an operational amplifier 12 whose negative input terminal receives an input voltage Vin. The output terminal of the operational amplifier 12 is connected to the gates of two field effect transistors 14 and 16, where the illustrated "N" value is equal to the ratio of their respective drain currents. The sources of the field effect transistors 14 and 16 are connected to a reference voltage Vdd. The drains of the field effect transistors 14 and 16 are connected to each other by a resistor (R1) 18. The drain of the field effect transistor 14 is connected in a feedback fashion to the positive input terminal of the operational amplifier 12, and is also connected to ground through a resistor (R2) 20. An output voltage Vout is supplied from the drain of the field effect transistor 16 to drive a transmission line 22 having a characteristic resistance equal to the load resistance (RL) 24. By properly selecting the values of the resistors R1 and R2 for the driver 10 in a well known manner (and as illustrated) with respect to the "N" value and the value of the load resistance RL, the value of the output impedance from the driver may be set (i.e., controlled) substantially equal to the load resistance RL. An advantage of this driver is its reduced power dissipation which makes it very attractive for implementation in an integrated circuit.

Most telecommunications devices utilize a push-pull B-class circuit with transformer decoupling of the driver and the transmission line. The FIG. 1 prior art driver has not, historically, been well suited for use in the push-pull B-class circuit as two such drivers are needed and they do not operate well together in push-pull. When one half of the push-pull circuit (i.e., one driver 10) generates some voltage in one half of the primary coil of the transformer, a flyback voltage appears in the other half of the primary coil. This flyback voltage penetrates to the input of the operational amplifier 12 of the other driver 10 through the feedback circuit connections and corrupts driver operation.

There accordingly exists a need for a push-pull type transformer line driver having a controlled or synthesized output impedance with reduced power dissipation and improved power efficiency for implementation in an integrated circuit.

SUMMARY OF THE INVENTION

A line driver circuit is provided for connection to a transformer having a center tapped primary coil. The circuit includes a pair of equivalent pre-drivers. Each pre-driver receives a driver input signal and outputs a buffer input signal and a flyback compensation signal proportional thereto. The circuit further includes a pair of equivalent controlled or synthesized impedance buffers for connection in a push-pull configuration to the primary coil. Each buffer receives the buffer input signal generated from one of the pre-drivers for buffered output as a line driver signal applied to the primary coil. Each buffer further receives the flyback compensation signal generated from the other one of the pre-drivers, with the buffer further operating to cancel a flyback voltage effect induced in that buffer by the line driver signal applied to the primary coil by the other buffer using the flyback compensation signal received from the other one of the pre-drivers.

The induced flyback voltage effect produces a flyback current experienced in each buffer. The pre-driver generates the flyback compensation signal proportional to the buffer input signal (which subsequently induces that flyback voltage effect) such that the current of the flyback compensation signal is substantially equal to the flyback current. The buffer then uses the input flyback compensation signal to cancel the flyback current through a subtraction operation.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 2:
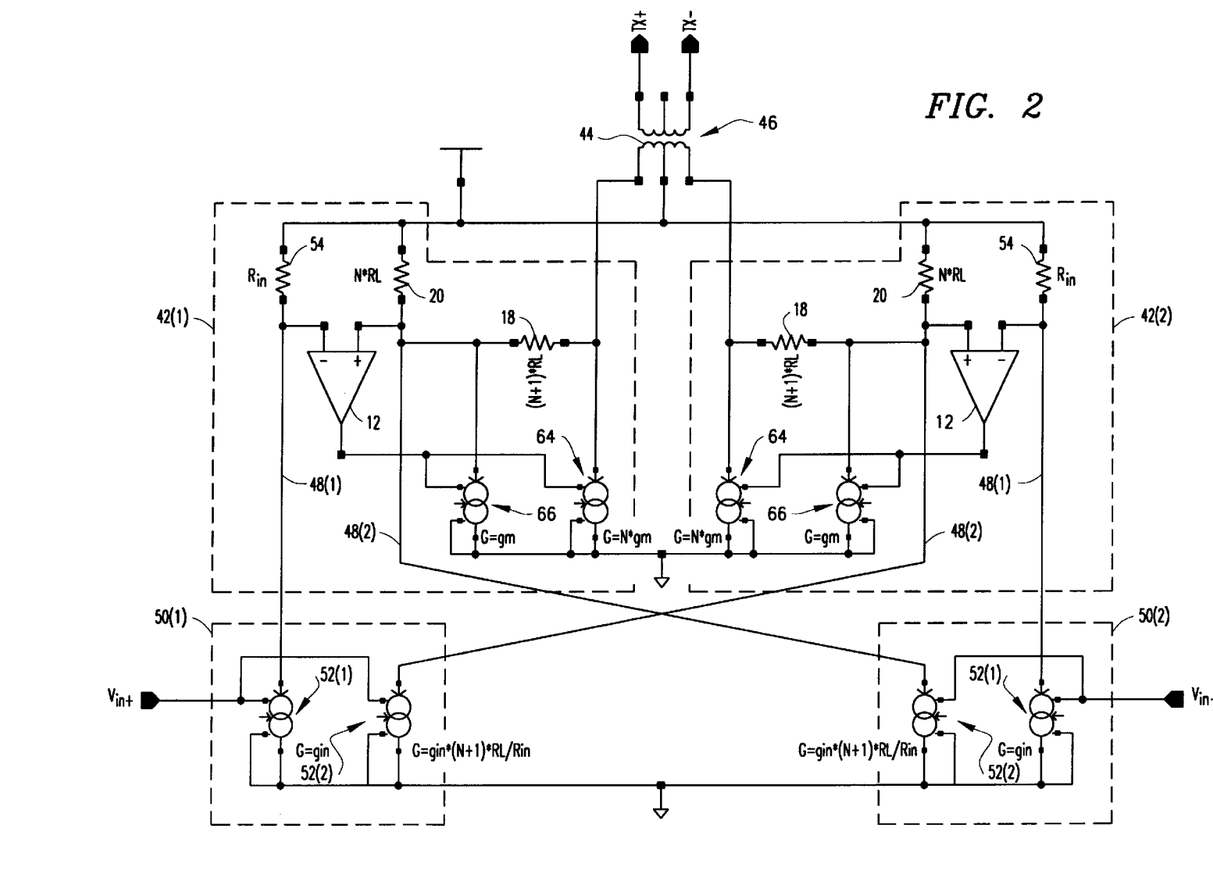
FIG. 2 is a schematic diagram of a push-pull type transformer line driver in accordance with the present invention.

Reference is now made to FIG. 2 wherein there is shown a schematic diagram of a push-pull type transformer line driver 40 in accordance with the present invention. The driver 40 includes a pair of identical controlled or synthesized impedance buffers 42(1) and 42 (2) whose outputs are connected to the end terminals of a center tapped primary coil 44 of a transformer 46 in a configuration constituting a push-pull circuit. Each buffer 42 may comprise the illustrated buffer, a buffer/driver similar or equivalent to that shown in FIG. 1, or another buffer/driver which provides a controlled or synthesized output impedance preferably with reduced power dissipation characteristics suitable for integrated circuit fabrication. Each buffer 42 includes a pair of inputs 48(1) and 48(2). In the specific implementation illustrated these inputs are applied to the negative and positive input terminals, respectively, of the included operational amplifier 12. One input 48(1) receives a buffer input signal, while the other input 48(2) receives a flyback compensation signal (the purpose of which will be described later).

The buffer input signal applied to the first input 48 (1) of each buffer 42 provides an input current that is passed through the buffer and output as a line driver signal for application to an end terminal of the center tapped primary coil 44 for the transformer 46. While outputting the line driver signal, the buffer 42 maintains the value of its output impedance for the connection to the transformer 46 in a condition set equal to the characteristic impedance RL of a transmission line (not shown) connected at TX+ and TX− terminals of the secondary coil. As was discussed above in connection with the prior art buffer/driver of FIG. 1, this line driver signal as applied by one buffer 42 (for example, buffer 42(1)) in such a push-pull configuration to one half of the primary coil induces a flyback voltage in the other half of the primary coil that penetrates (as an unwanted flyback signal) through the other buffer (for example, buffer 42(2), which at that time is inactive) to corrupt driver 40 operation. This is especially a concern when a buffer/driver of the prior art FIG. 1 type (or similar) is used because the unwanted flyback signal may pass through the feedback loop of the buffer to the positive input terminal of the operational amplifier 12.

To address this issue, the driver 40 further includes a pair of pre-driver circuits 50(1) and 50(2). Each pre-driver circuit 50 receives an input signal (Vin in differential ± format) and outputs two signals: a first signal comprising the buffer input signal for application to the first input 48 (1) of one of the buffers 42 (for example, buffer 42(1)); and a second signal comprising the flyback compensation signal for application to the second input 48(2) of the other buffer 42 (for example, buffer 42(2)). Thus, it is recognized that the buffer input signal generated by the first pre-driver 50 (1) is applied to the first input 48(1) of the first buffer 42(1), while the flyback compensation signal generated by the first pre-driver 50(1) is applied to the second input 48(2) of the second buffer 42(2). Conversely, the buffer input signal generated by the second pre-driver 50(2) is applied to the first input 48(1) of the second buffer 42(2) while the flyback compensation signal generated by the second pre-driver 50 (2) is applied to the second input 48(2) of the first buffer 42(1). It will be understood that the pre-driver may alternatively be implemented as a differential circuit (to process the received driver input voltage signal and generate the appropriate input voltage and flyback compensation signals) instead of having two equivalent pre-drivers 50(1) and 50(2).

The flyback compensation signal as generated by the pre-driver 50 is proportional (in current) to the buffer input signal. The ratio of the currents for these signals is selected in such a way that current of the flyback voltage induced in the primary coil of the transformer by the adjacent half of the push-pull driver (as represented by the unwanted flyback signal that penetrates through the feedback to the input of the operational amplifier, and due to the applied line driver signal) is substantially equal to current of the generated flyback compensation signal. Under this condition, the operation of one buffer 42 does not affect the operation of the other included buffer as these two signals will cancel each other (through a subtraction operation) at the output of the operational amplifier 12.

The values of the resistances and transconductances for the components of each buffer 42 in a preferred embodiment are set as recited with respect to the driver/buffer 10 of FIG. 1 in order to provide a controlled output impedance matching the characteristic impedance RL of the transmission line. Each pre-driver 50 includes a pair of controlled current sources 52(1) and 52(2) that receive the driver input voltage signal and output the input voltage signal and flyback compensation signal. The output of the first current source 52(1) is connected to the negative input terminal of the operational amplifier of one buffer 42 (to provide the buffer input signal) and the output of the second current source 52(2) is connected to the positive input terminal of the operational amplifier of the other buffer (to provide the flyback compensation signal). The values of the transconductances of the first and second current sources 52(1) and 52(2), respectively, must be properly chosen such that the current of flyback voltage (i.e., the unwanted flyback signal) induced in one half of the primary coil of the transformer by the adjacent half of the push-pull driver will be substantially equal to the generated flyback compensation signal (i.e., to set the appropriate proportional relationship). Given the values of the resistances and transconductances for the components of each buffer 42 as set forth above (see, FIG. 1), the appropriate transconductances for the first and second current sources 52(1) and 52(2) are as follows:

G(source 52(1))=gin; and

G(source 52(2))=gin*Rin/(N+1)RL, wherein gin is the transconductance of the input signal source and Rin is the resistance value for the input resistor 54 connected between the reference voltage (Vdd) and the negative input terminal of the operational amplifier 12 in each buffer 42. When set in the above-recited manner, the driver 40 operates without the adverse affects of line driver signal induced flyback.

Figures 3A, 3B, 3C, 3D:
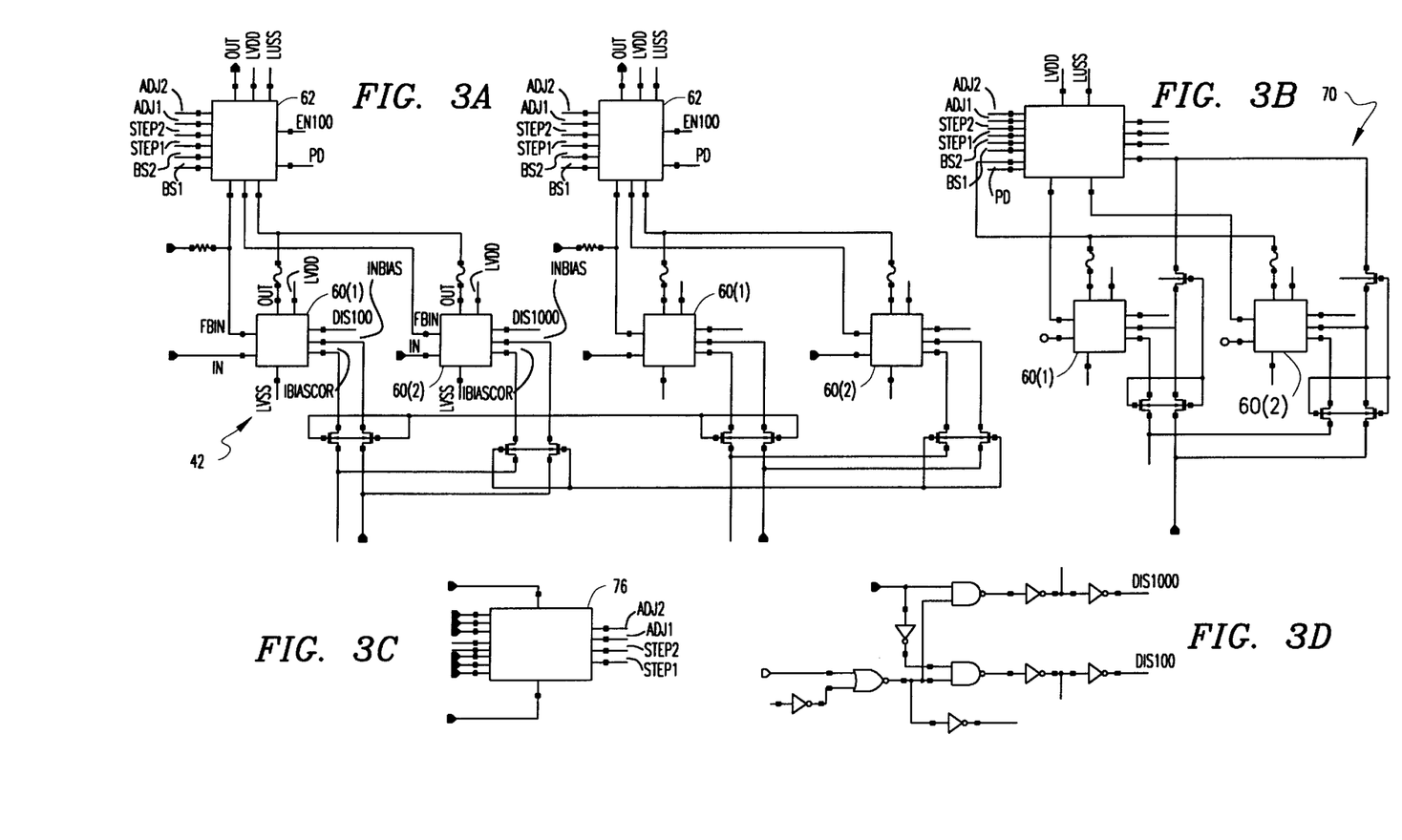
FIGS. 3A–3D and 4–12 are schematic diagrams of a possible design for the push-pull type transformer line driver of FIG. 2 as configured for implementation in an integrated circuit.
Figure 4:
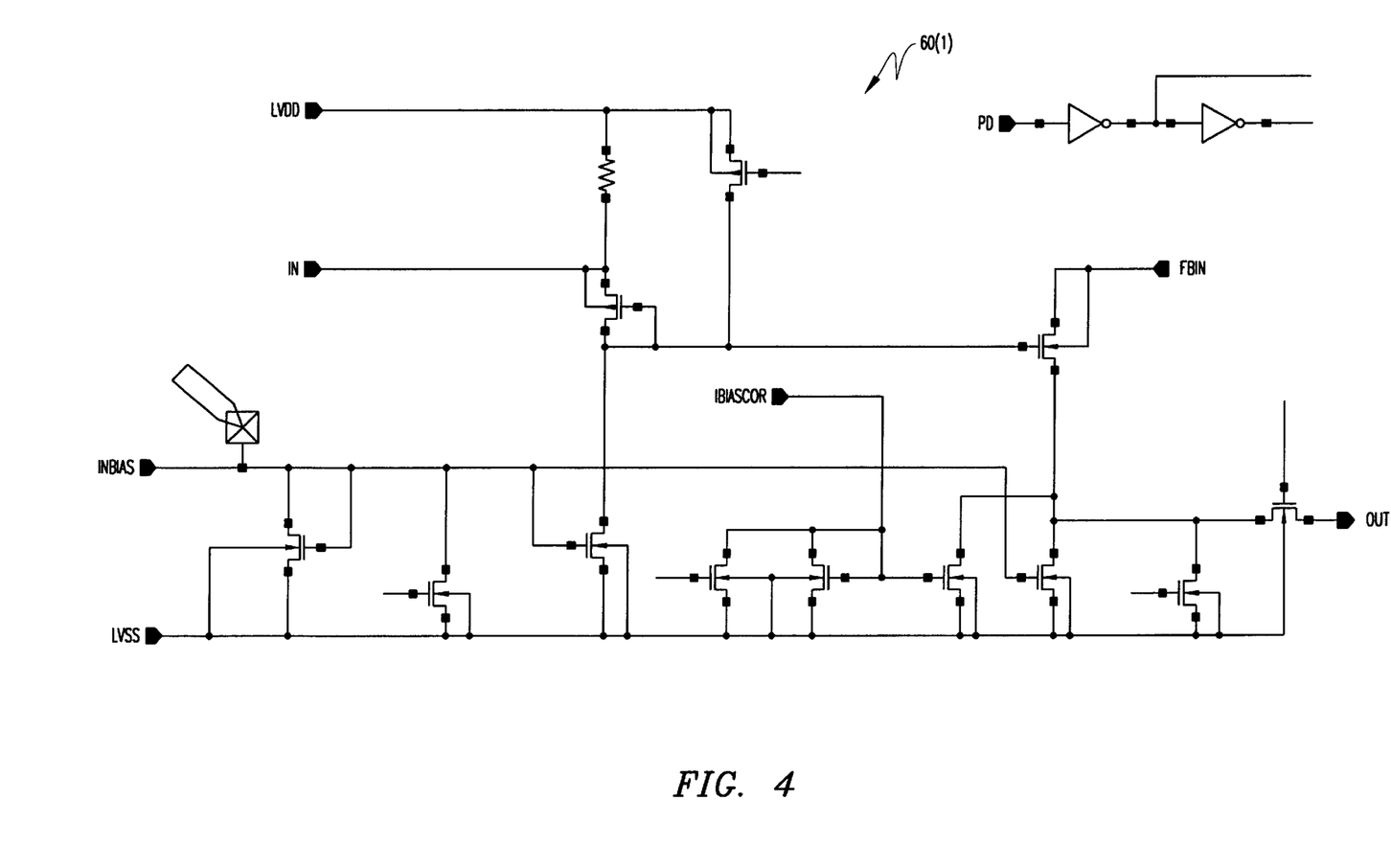
Figure 5:
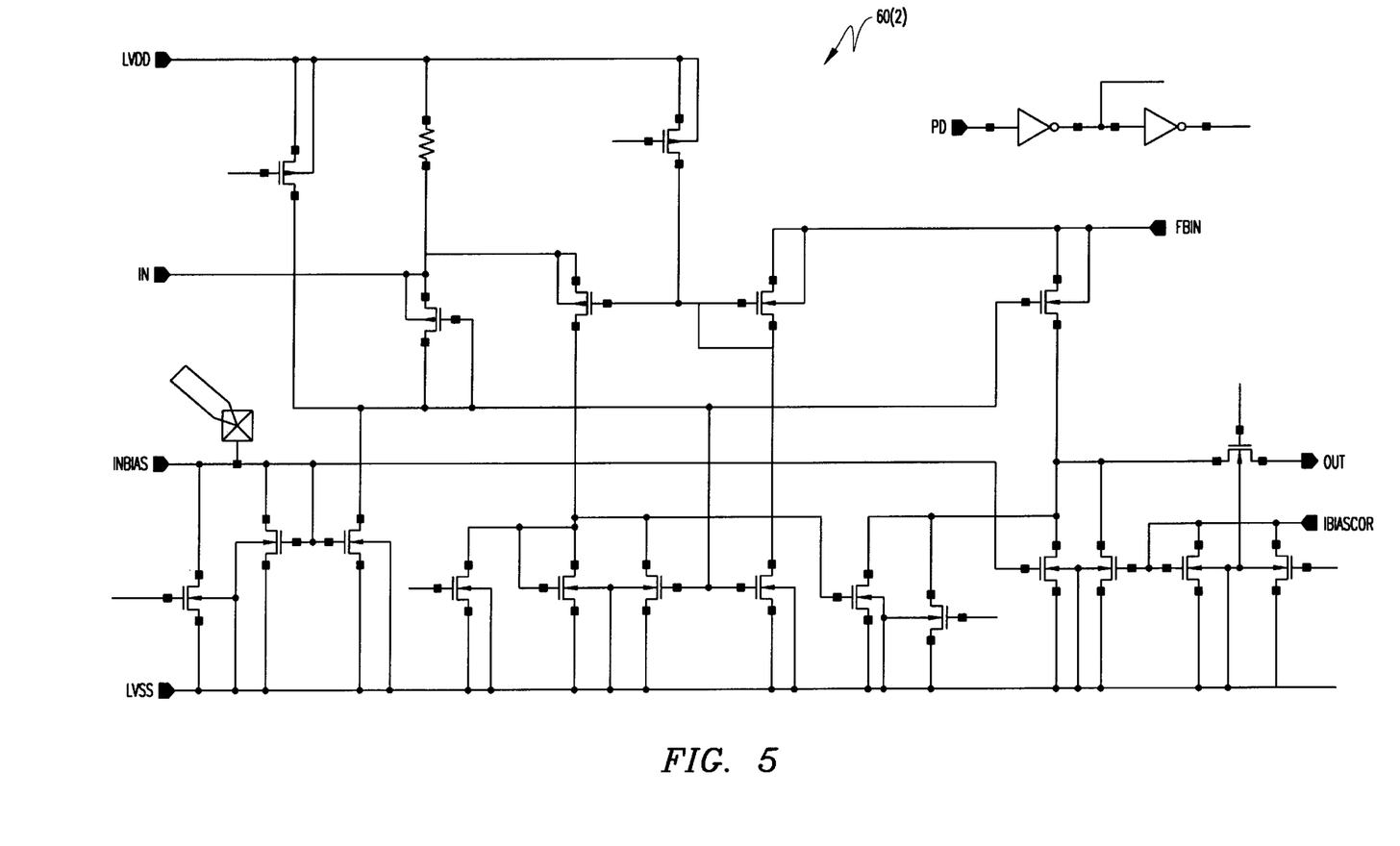
Figure 6:
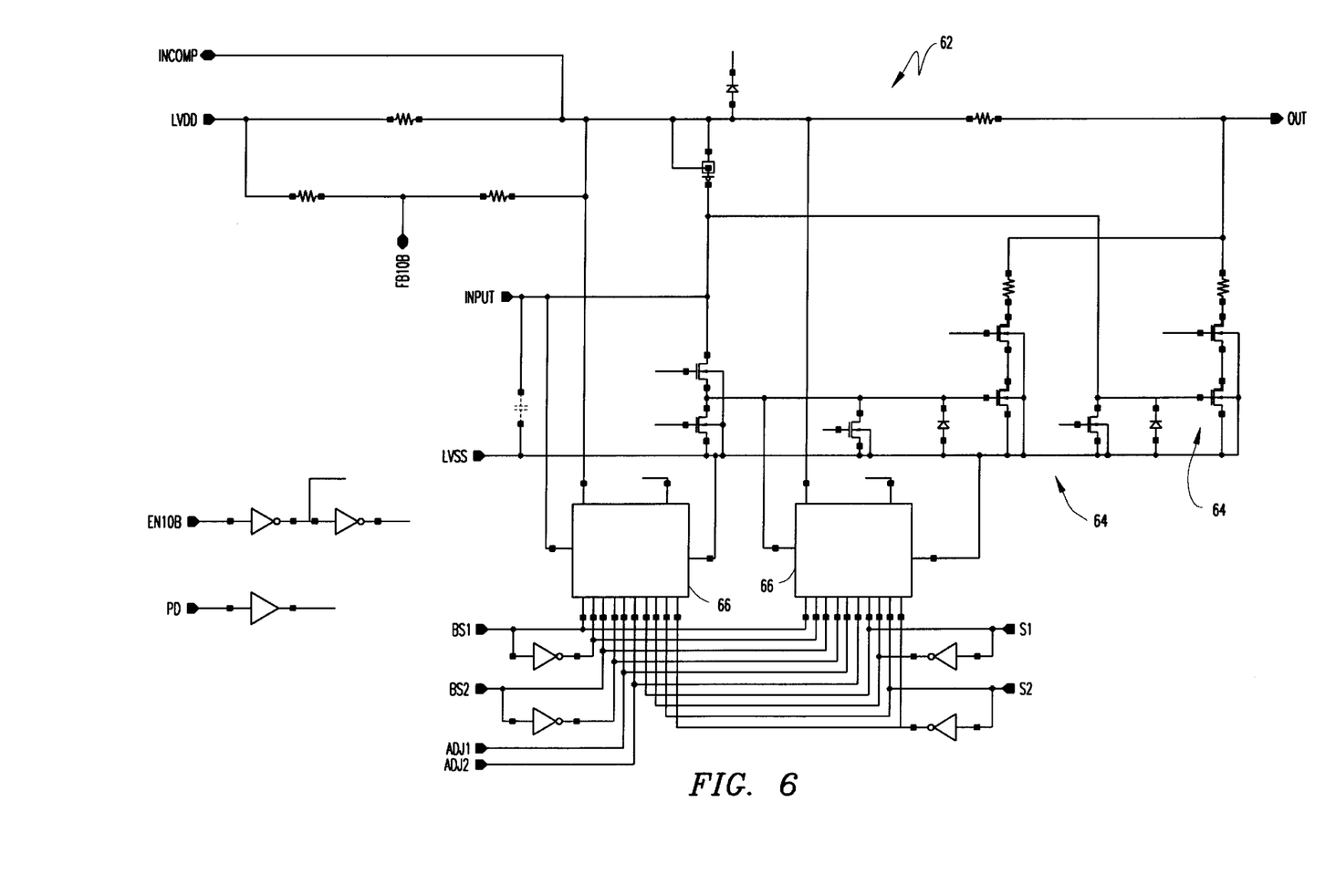
Figure 7:
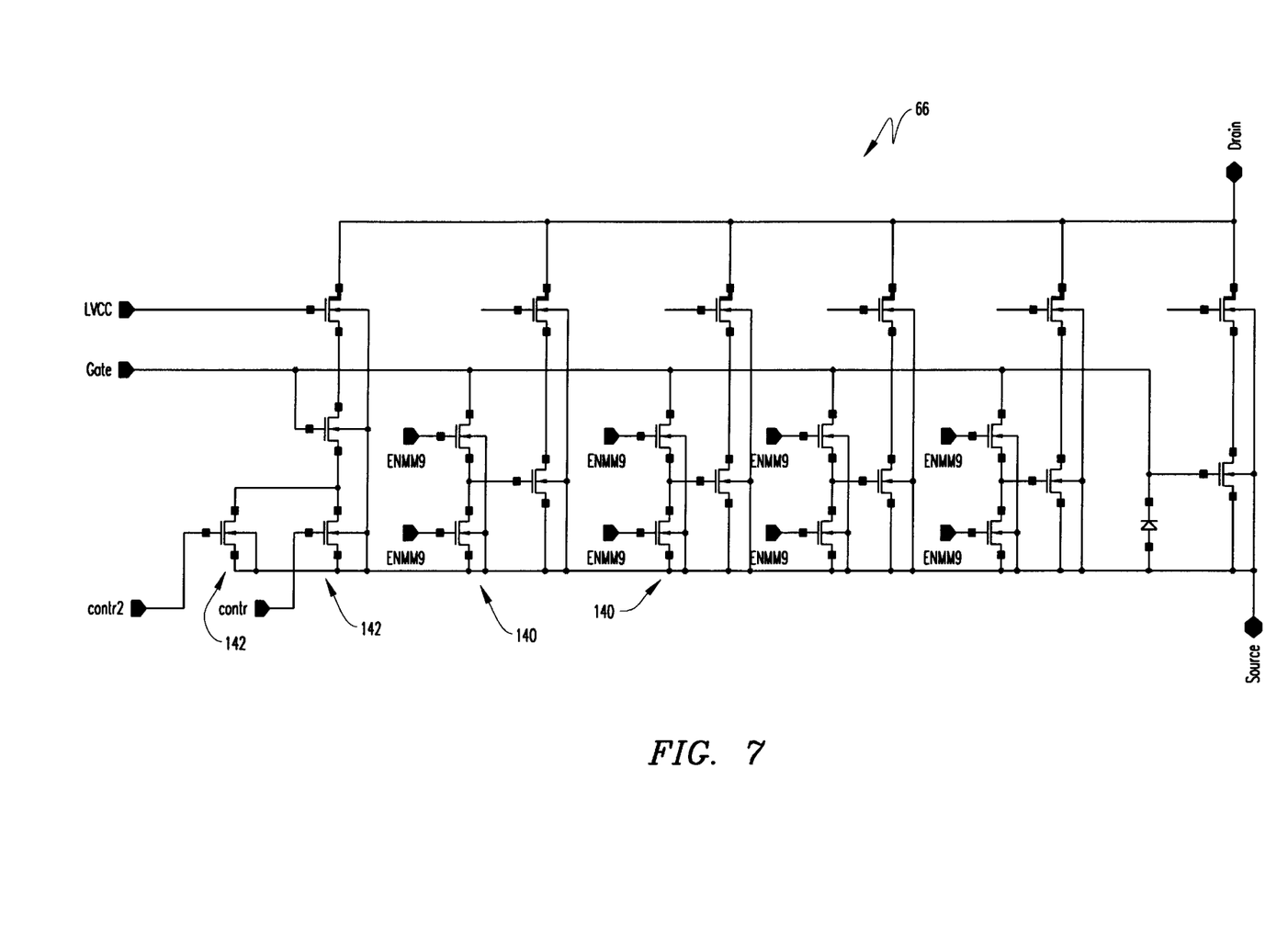
Figure 11:
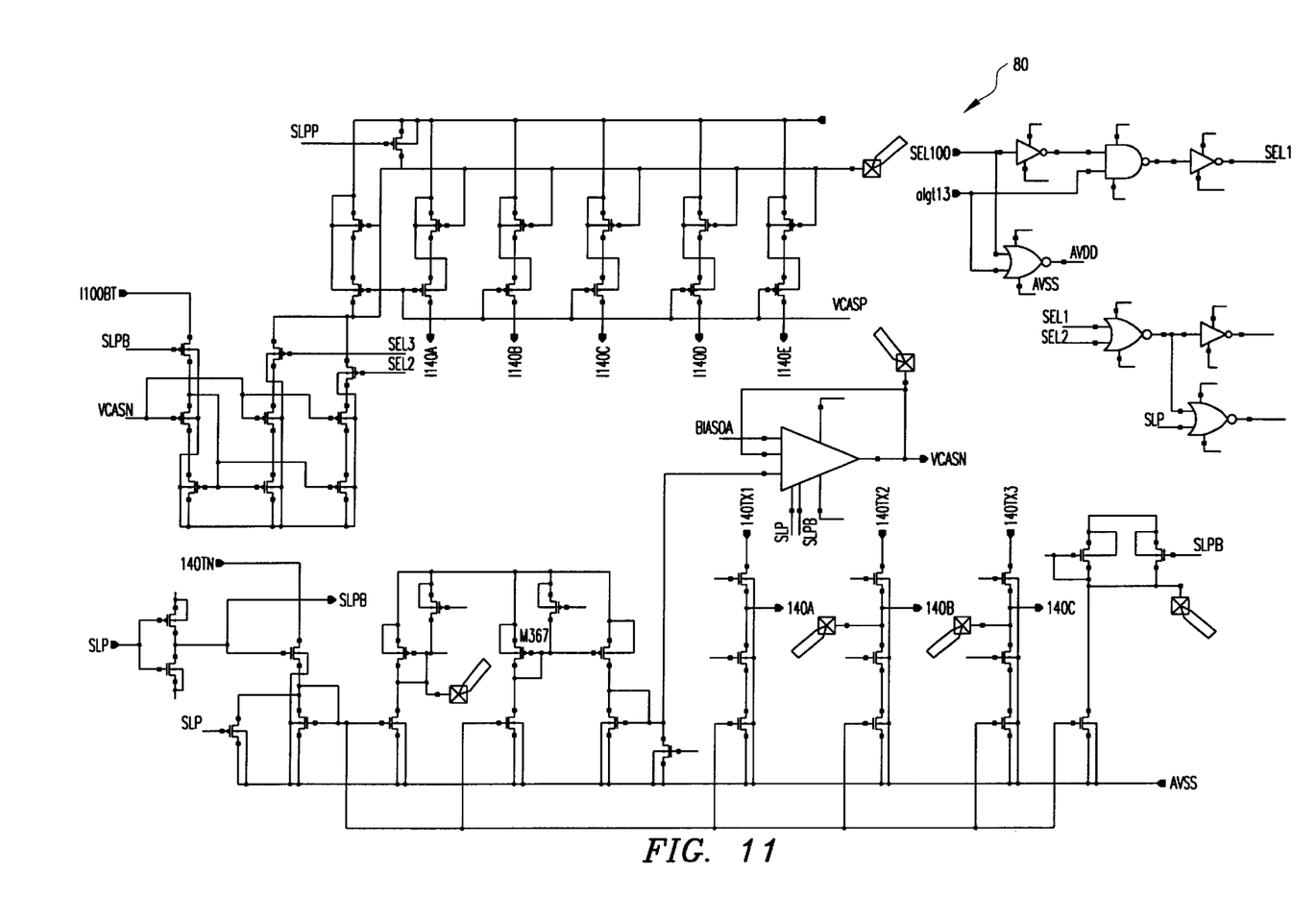
Figure 12:
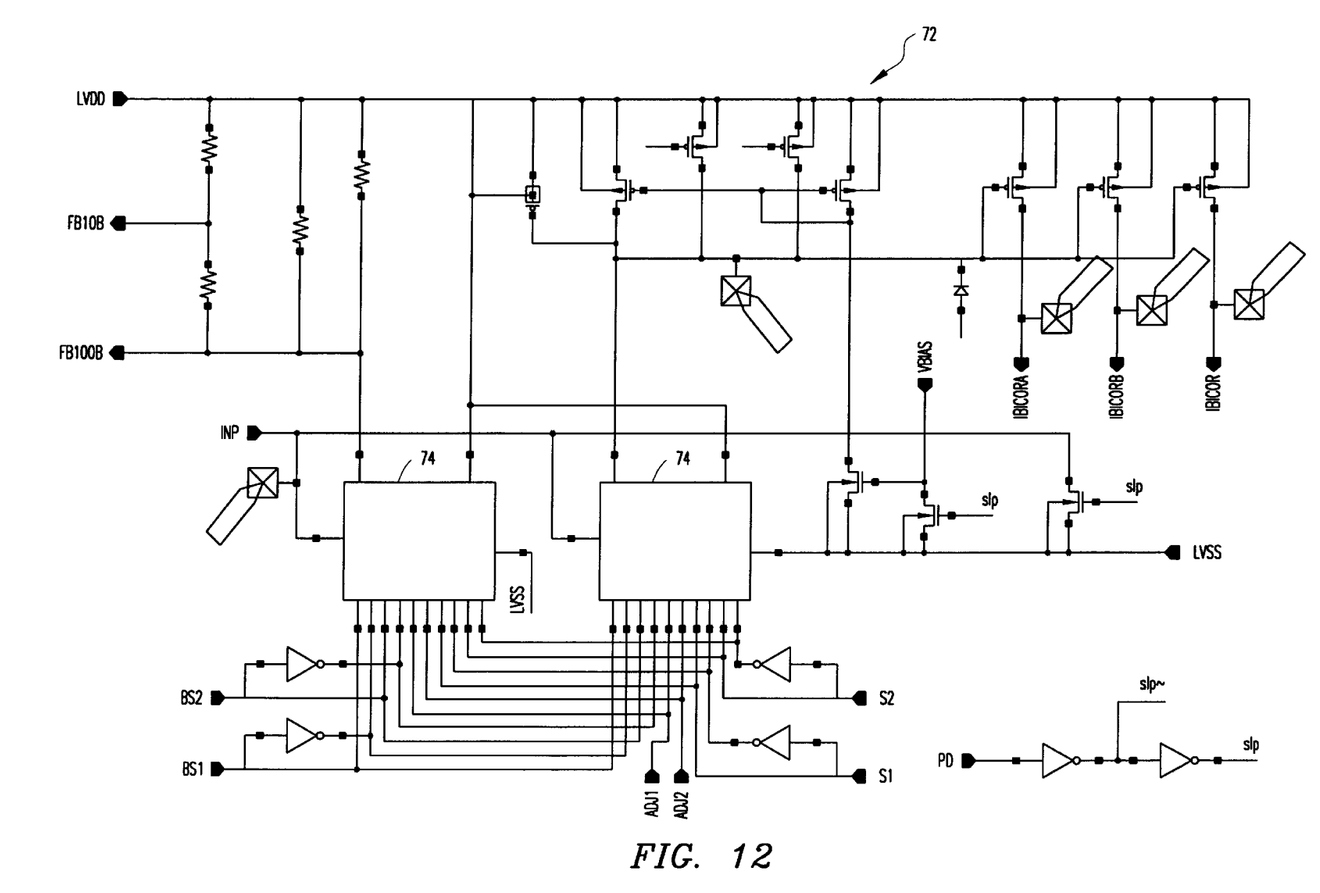

Reference is now made to FIGS. 3A–3D and 4–12 wherein there are shown schematic diagrams of one design for the push-pull type transformer line driver 40 of FIG. 2 as configured for implementation in an integrated circuit. Turning first to FIG. 3A, there is shown a block diagram for the pair of buffers 42. The buffers 42 include a plurality of input stages 60 and a plurality of output stages 62. The input stages 60 are equivalent to the operational amplifiers 12 for the buffer 42. A more detailed schematic of the input stage 60(1) used for operation in 10BASE-T mode is shown in FIG. 4. A more detailed schematic of the input stage 60(2) used for operation in 100BASE-TX mode is shown in FIG. 5. A more detailed schematic of the output stage 62 is shown in FIG. 6. Each output stage 62 contains a pair of fixed controlled current sources 64 and a pair of adjustable controlled current sources 66. These components perform the same functions as the current sources 14 and 16 for the buffer 42. A more detailed schematic of the adjustable controlled current source 66 is shown in FIG. 7. FIG. 3B illustrates a schematic diagram for a circuit 70 to control the quiescent current of the driver. The circuit 70 includes a control circuit 72 whose more detailed schematic diagram is shown in FIG. 12, plus a pair of input stages 60(1) and 60(2) whose more detailed schematic diagrams are shown in FIGS. 4 and 5, respectively. The control circuit 72 of FIG. 12 includes a pair of adjustable controlled current sources 74 that are identical to the ones (reference 66) shown in FIG. 6. A more detailed schematic diagram of the circuit 74 is thus shown in FIG. 7. FIG. 3C illustrates the circuit block 76 for tuning the output impedance of the drivers 42. A more detailed explanation of the configuration and operation of the circuit block 76 is provided in commonly-assigned, co-pending application for patent Ser. No. 09/497,980 by Oleksiy Zabroda entitled "SELF-ADJUSTABLE IMPEDANCE TRANSFORMER LINE DRIVER" the disclosure of which is hereby incorporated by reference. FIG. 3D illustrates the mode of operation control logic for the driver 42.

Figure 8:
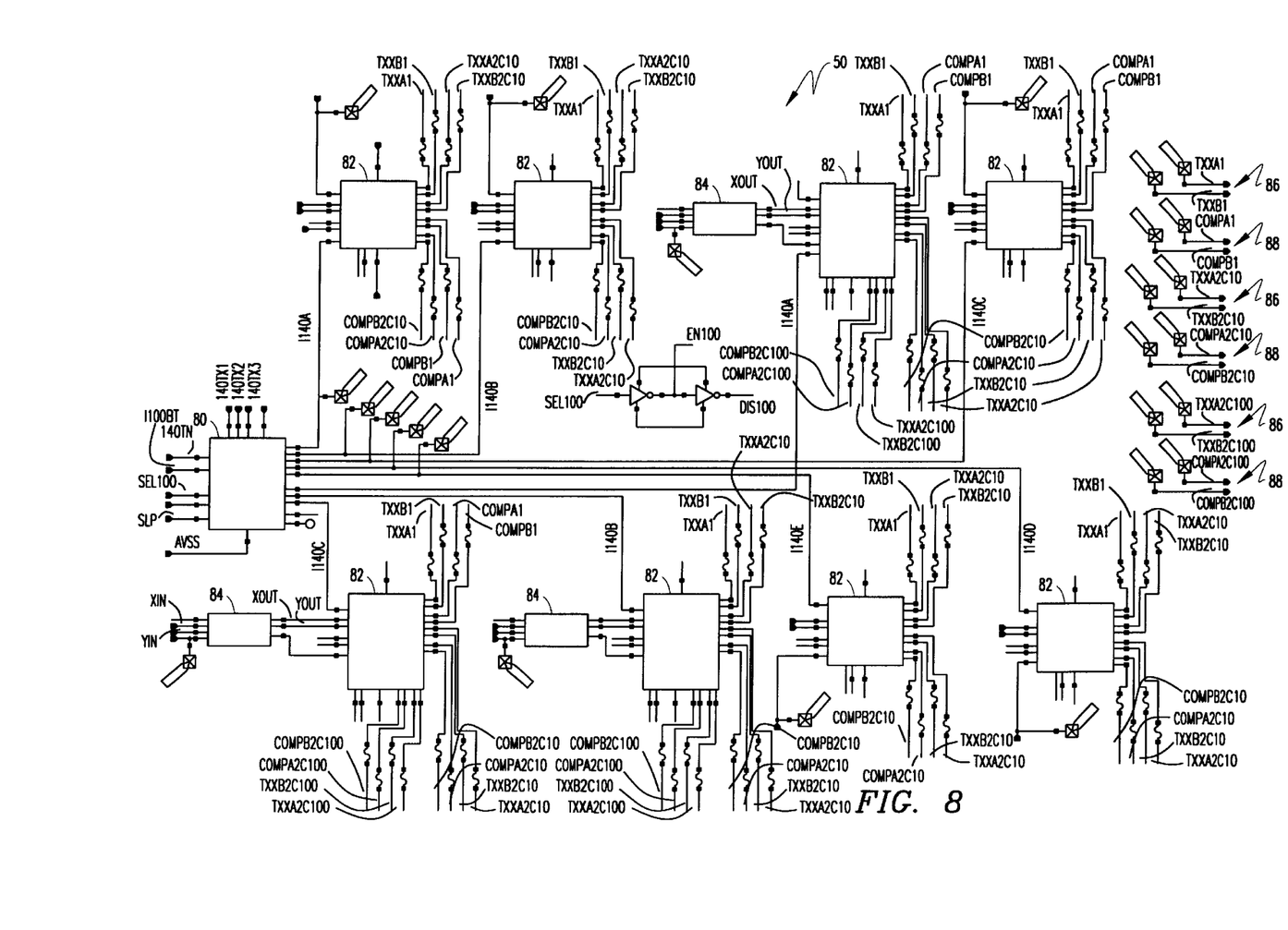
Figure 9:
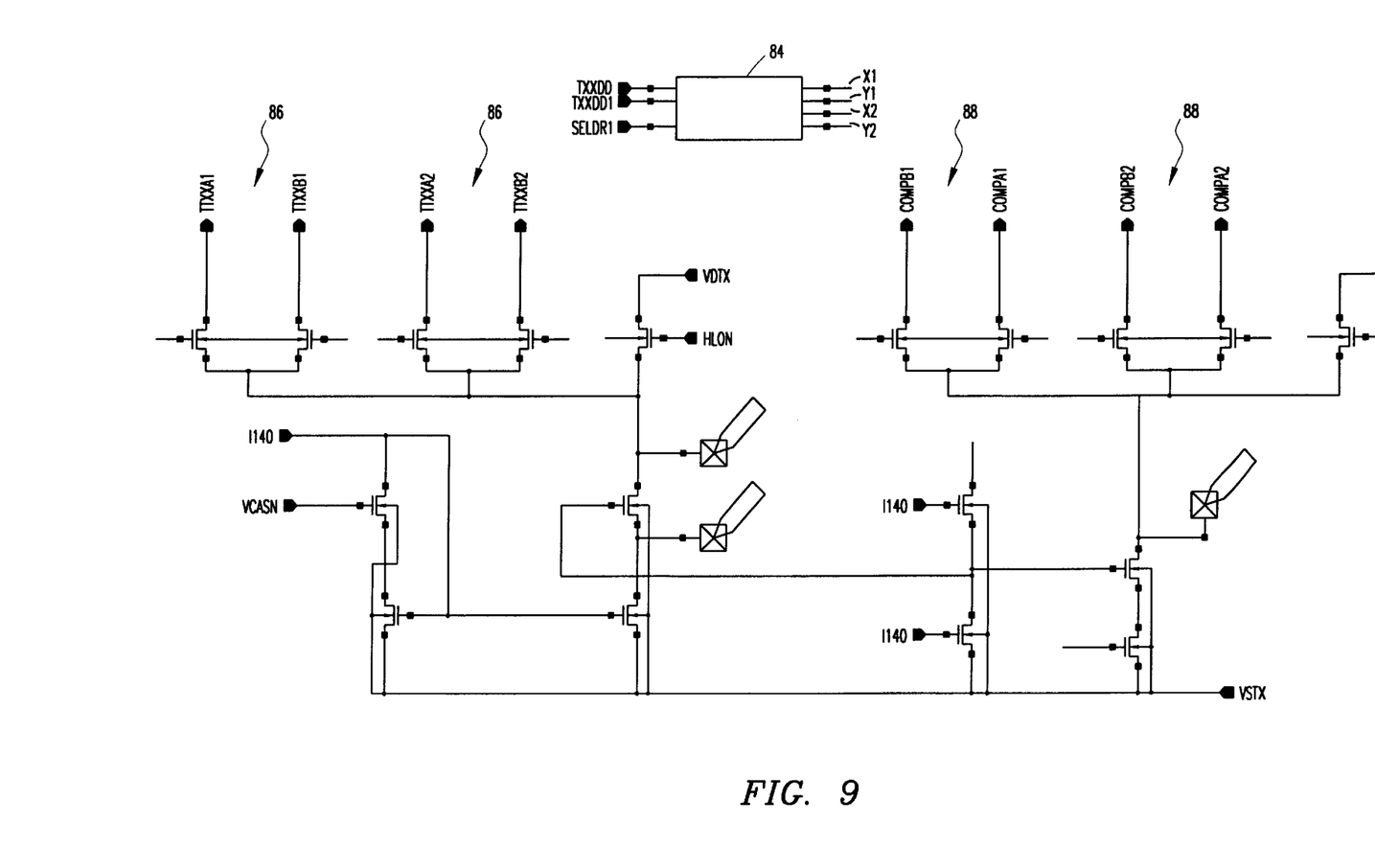
Figure 10:
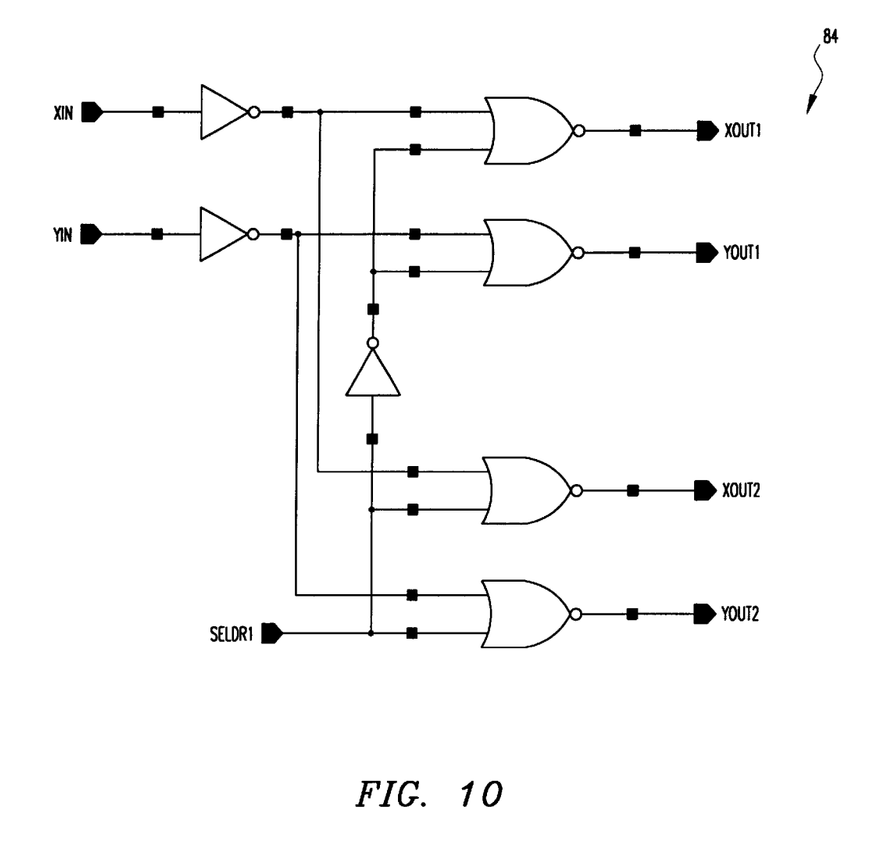

As mentioned above, the line driver 40 further includes a pair of pre-drivers 50 whose schematic block diagram is provided in FIG. 8. The pre-driver 50 comprises a current D/A converter that is used for waveshaping of the 10BASE-T and 100BASE-TX driver output signals. It includes a reference current generating block 80, a set of pre-driver D/A converter current cells 82, and a plurality of pre-driver output selecting circuits 84. A more detailed schematic diagram of the reference current generating block 80 is shown in FIG. 11. A more detailed schematic diagram of the pre-driver D/A converter current cell 82 is shown in FIG. 9, which further illustrates that outputs 86 are used as the inputs to one buffer to provide the buffer input signal, and outputs 88 are used as the inputs to the other buffer to provide the flyback compensation signal. The cell 82 produces the inputs for either buffer 42(1) or 42(2) in accordance with the commands issued by the pre-driver output selecting circuit 84 whose more detailed circuit diagram is shown in FIG. 10. FIG. 9 in particular shows that the current cell 82 is capable of simultaneously producing the buffer input signal (from output 86) for one half of the driver 40 and the flyback compensation signal (from outputs 88) for the other half of the driver 40.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A line driver circuit for connection to a transformer having a center tapped primary coil, comprising:

a first buffer with a controlled or synthesized output impedance having a first and second input and an output providing a first driver signal buffered from the first input for connection to a first end terminal of the center tapped primary coil;

a second buffer with a controlled or synthesized output impedance having a first and second input and an output providing a second driver signal buffered from the first input for connection to a second end terminal of the center tapped primary coil;

wherein the first driver signal induces a first flyback voltage effect in the second buffer through the transformer and wherein the second driver signal induces a second flyback voltage effect in the first buffer through the transformer;

a first pre-driver having an input for receiving a driver input voltage signal, a first output for providing the first driver signal to the first input of the first buffer and a second output for providing a first compensation signal to the second input of the second buffer to compensate for the first flyback voltage effect induced by the first driver signal; and a second pre-driver having an input for receiving the driver input voltage signal, a first output for providing the second driver signal to the first input of the second buffer and a second output for providing a second compensation signal to the second input of the first buffer to compensate for the second flyback voltage effect induced by the second driver signal.

2. The circuit of claim 1:

wherein the first flyback voltage effect produces a first flyback signal, and wherein second buffer includes a circuit to substantially cancel the first flyback signal with the first flyback compensation signal; and wherein the second flyback voltage effect produces a second flyback signal, and wherein first buffer includes a circuit to substantially cancel the second flyback signal with the second flyback compensation signal.

3. The circuit of claim 1 wherein:

the first flyback compensation signal is proportional to the first driver signal that induces the first flyback voltage effect in the second buffer such that the first flyback voltage effect is substantially canceled in the second buffer by the received first compensation signal; and the second flyback compensation signal is proportional to the second driver signal that induces the second flyback voltage effect in the first buffer such that the second flyback voltage effect is substantially canceled in the first buffer by the received second compensation signal.

4. The circuit of claim 1 wherein: the first pre-driver comprises:

a first current source with a first transconductance and operable to provide the first driver signal; and a second current source with a second transconductance and operable to provide the first flyback compensation signal that is proportional to the first driver signal.

5. The circuit of claim 1 wherein: the second pre-driver comprises:

a first current source with a first transconductance and operable to provide the second driver signal; and a second current source with a second transconductance and operable to provide the second flyback compensation signal that is proportional to the second driver signal.

6. A line driver circuit for connection to a transformer having a primary coil, comprising:

a pair of equivalent pre-drivers, each pre-driver receiving a driver input signal and outputting a buffer input signal and a flyback compensation signal proportional thereto; and a pair of equivalent controlled or synthesized impedance buffers for connection in a push-pull configuration to the primary coil, each buffer receiving the buffer input signal from one of the pre-drivers for buffered output as a line driver signal to the primary coil, wherein each buffer experiences a flyback voltage effect induced in that buffer by the line driver signal applied to the primary coil by the other buffer, each buffer further receiving the flyback compensation signal from the other one of the pre-drivers and operating to cancel the induced flyback voltage effect using the flyback compensation signal received from the other one of the pre-drivers.

7. The circuit of claim 6 wherein the flyback voltage effect produces a flyback signal in the buffer, and each buffer includes a circuit to substantially cancel the flyback signal with the flyback compensation signal.

8. The circuit of claim 6 wherein each pre-driver comprises:

a first current source with a first transconductance and operable to provide the buffer input signal; and a second current source with a second transconductance and operable to provide the flyback compensation signal that is proportional to the first driver signal.

9. A method for push-pull line driver operation, the driver including a first push-pull half and a second push-pull half, comprising the steps of:

generating a first buffer input signal and first flyback compensation signal proportional thereto from a received first input signal;

generating a second buffer input signal and second flyback compensation signal proportional thereto from a received second input signal;

buffering of the first buffer input signal through the first push-pull half to generate a first line driver signal for application to a first terminal of a transformer primary coil, the first line driver signal inducing a first flyback voltage in the primary coil that generates a first flyback signal in the second push-pull half;

buffering of the second buffer input signal through the second push-pull half to generate a second line driver signal for application to a second terminal of the transformer primary coil, the second line driver signal inducing a second flyback voltage in the primary coil that generates a second flyback signal in the first push-pull half;

canceling the first flyback signal in the second push-pull half using the first flyback compensation signal; and canceling the second flyback signal in the first push-pull half using the second flyback compensation signal.

10. The method as in claim 9 wherein the first and second input signals comprise differential signals of an input signal.

11. The method as in claim 9 further including the step of operating the first and second push-pull halves in a controlled or synthesized output impedance mode.

* * * * *